(12) United States Patent
Nicolai et al.

(10) Patent No.: US 8,499,575 B2
(45) Date of Patent: Aug. 6, 2013

(54) AIR-CONDITIONING SYSTEM FOR ELECTRONIC COMPONENTS

(75) Inventors: Walter Nicolai, Buseck (DE); Simon Jocham, München (DE); Wilfried Hofmann, München (DE)

(73) Assignee: NFT Nanofiltertechnik Gesselschaft mit beschrankter Haftung, Bad Homburg (DE)

( * ) Notice: Subject to any disclaimer, the term of this patent is extended or adjusted under 35 U.S.C. 154(b) by 249 days.

(21) Appl. No.: 12/922,413

(22) PCT Filed: Mar. 4, 2009

(86) PCT No.: PCT/EP2009/001510
§ 371 (c)(1),
(2), (4) Date: Dec. 3, 2010

(87) PCT Pub. No.: WO2009/112185
PCT Pub. Date: Sep. 17, 2009

(65) Prior Publication Data
US 2011/0192173 A1   Aug. 11, 2011

(30) Foreign Application Priority Data
Mar. 12, 2008 (DE) .......................... 10 2008 013 850

(51) Int. Cl.
| | |
|---|---|
| F25D 23/12 | (2006.01) |
| F25B 21/02 | (2006.01) |
| F25D 17/06 | (2006.01) |
| F28D 15/00 | (2006.01) |
| H05K 7/20 | (2006.01) |

(52) U.S. Cl.
USPC .................. 62/259.2; 62/3.2; 62/3.3; 62/412; 165/104.33; 361/690

(58) Field of Classification Search
USPC .................. 62/3.2, 3.3, 3.6, 259.2, 415, 407, 62/412, 263; 165/104.33; 361/688, 690; 700/236
See application file for complete search history.

(56) References Cited

U.S. PATENT DOCUMENTS
4,065,936 A * 1/1978 Fenton et al. .................... 62/3.3
5,706,668 A   1/1998 Hilpert
(Continued)

FOREIGN PATENT DOCUMENTS
DE   19829440 A1   1/2000
DE   29921448 U1   2/2000
(Continued)

OTHER PUBLICATIONS

International Search Report on Patentability, PCT/EP2009/001510, Sep. 14, 2010, 7 pages.
(Continued)

*Primary Examiner* — Judy Swann
*Assistant Examiner* — Christopher R Zerphey
(74) *Attorney, Agent, or Firm* — Senniger Powers LLP

(57) ABSTRACT

The air conditioning device for electronic components features three channels (6, 7, 8) for two flowing fluids that are in heat exchange with one another. In the first operating mode these two fluids are guided by means of switchable flaps into two selected channels (7, 8) where they are in heat exchange with one another at a partition (12) that is equipped with heat exchange elements (12, 13). In a second operating mode the flaps are switched in such a manner that the two fluids are in heat exchange with one another at a Peltier element (9) that is equipped on both sides with heat exchange elements (9, 11). In a third operating mode the Peltier element is switched as a heating element. In the first operating mode on the other hand the Peltier element is deactivated and consumes no electric energy.

16 Claims, 2 Drawing Sheets

U.S. PATENT DOCUMENTS

| | | | |
|---|---|---|---|
| 6,058,712 A * | 5/2000 | Rajasubramanian et al. | 62/3.6 |
| 6,149,254 A | 11/2000 | Bretschneider et al. | |
| 6,213,198 B1 * | 4/2001 | Shikata et al. | 165/202 |
| 6,552,457 B2 * | 4/2003 | Uruma et al. | 310/91 |
| 6,742,583 B2 * | 6/2004 | Tikka | 165/291 |
| 7,458,416 B2 | 12/2008 | Hofmann | |
| 7,502,227 B2 * | 3/2009 | Uchida et al. | 361/679.48 |
| 7,958,741 B2 * | 6/2011 | Pettitt | 62/324.1 |
| 2008/0295999 A1 * | 12/2008 | Mitsui | 165/104.33 |
| 2010/0126696 A1 * | 5/2010 | Novotny et al. | 165/67 |

FOREIGN PATENT DOCUMENTS

| | | |
|---|---|---|
| DE | 20007920 U1 | 9/2000 |
| DE | 20105487 U1 | 10/2001 |
| DE | 20301232 U1 | 5/2003 |
| DE | 10218115 A1 | 6/2003 |
| DE | 10218343 A1 | 11/2003 |
| DE | 102004030675 A1 | 11/2005 |
| DE | 102006020499 A1 | 10/2007 |
| DE | 102006020502 A1 | 10/2007 |
| DE | 102006020503 A1 | 10/2007 |
| DE | 102006034487 A1 | 1/2008 |
| EP | 1939549 A2 | 2/2008 |
| JP | 2005044857 A | 2/2005 |
| WO | 0236241 A1 | 5/2002 |

OTHER PUBLICATIONS

Abstract of DE10218115; Jun. 26, 2003.
Abstract of DE102006034487; Jan. 24, 2008.
Abstract of W00236241; May 10, 2002.
Abstract of DE102004030675; Nov. 10, 2005.
International Search Report, PCT/EP2009/001510, dated Jul. 8, 2010, 3 pages.
Abstract of JP2005044857; Feb. 17, 2005.
Abstract of DE20301232; May 28, 2003.

* cited by examiner

# AIR-CONDITIONING SYSTEM FOR ELECTRONIC COMPONENTS

REFERENCE TO RELATED APPLICATIONS

This application claims priority to German application 102008013850.9 filed 12 Mar. 2008.

FIELD OF THE INVENTION

The invention concerns an air conditioning device for electronic components according to the preamble of the patent claim 1.

BACKGROUND OF THE INVENTION

Such an air conditioning device is known from DE 10 2004 030 675 A1. There a refrigeration installation is described for electronic components that features a mounting plate to which electronic components are attached in heat-conducting contact. To the mounting plate several heat exchanger elements are attached. The mounting plate forms thereby the back wall of a switch box and is covered by means of a cover so that a flow channel forms that is located outside the interior space of the switch box and to which external air is guided by means of a blower. In the interior space an additional air stream can be generated along the mounting plate by means of convection or an additional blower.

Furthermore it is proposed there to utilize special heat exchanger elements such as they are described in DE 102 33 736.

These known refrigeration installations work in principle with an air/air heat exchange, whereby one assumes that the external air is colder than the internal air in the interior space of the switch box. As is well known, the heat exchange in a heat exchanger depends very significantly on the temperature difference of the media that are in heat exchange with one another. As a result the cooling performance of the known installations is not satisfactory in the case of high external temperatures.

As part of prior art active refrigeration installations that work according to the principle of a refrigerator with a compressor or with a Peltier element (compare U.S. Pat. No. 5,706,668) are therefore also already known As an example DE 10 2006 034 487 A1 describes a heat exchanger with Peltier elements that are on both sides in a heat-exchanging contact with heat releasing and heat absorbing elements, whereby respectively a fluid heating and a fluid cooling channel abuts against the heat releasing and heat absorbing elements.

Refrigeration installations with Peltier elements are also described in DE 10 2006 020 502 and 10 2006 020 503, DE 10 2006 020 499, DE 299 21 448 U1, and DE 203 01 232 U1.

The DE 201 05 487 U1 describes a refrigeration device with Peltier elements whereby a switch-over between individual cooling modes is possible, depending on the surrounding temperature, due to the fact that the Peltier elements can be switched either all in parallel, or group-wise or as a whole in series, whereby the cooling performance is controllable by simple means.

The DE 200 07 920 U1 describes a blower apparatus for a housing with Peltier elements whereby the air stream can be reversed in a selectable manner in order to switch between cooling and heating operation.

Peltier elements are obtainable today as flat platelets with heat-releasing and heat-absorbing side. Of a disadvantage is of course their consumption of electrical energy and the problem that the efficiency or the cooling performance is temperature-dependent and diminishes with increasing temperature difference between heat-absorbing side and heat-releasing side.

It is the purpose of the invention to improve the air conditioning device of the type referred to above insofar that it maintains the temperature of electronic components well within a prescribed temperature range over a large temperature range of the external temperature with a low consumption of electrical energy.

SUMMARY OF THE INVENTION

The problem is solved according to the characteristics indicated in patent claim 1. Advantageous embodiments and improvements of the invention can be deduced from the sub-claims.

The basic principle of the invention is to switch between air/air heat exchange and Peltier operation. To that effect three flow channels are provided that can be selected by means of switchable flaps so that respectively only two channels are traversed by the heat exchange medium, especially air.

In a practical embodiment example an interior channel, a middle channel and an exterior channel are provided. The interior channel borders an interior space in which the electronic components are disposed. Between the interior channel and the middle channel a Peltier element is disposed that is equipped with heat exchanger elements on both sides.

Between the interior channel and the exterior channel a partition is disposed that is also coated with heat exchanger elements on both sides.

In the operation mode "air/air heat exchange" the flow paths through the flaps are selected in such a manner that external air flows through the external channel and internal air flows through the middle channel so that a heat exchange occurs between middle channel and exterior channel by means of the heat exchanger elements on the partition wall.

During Peltier operation the flow paths through the flaps are selected in such a manner that the exterior air flows through the middle channel and the internal air flows through the internal channel. The two air streams therefore flow on both sides of the Peltier element. By these means an active cooling operation as well as also an active heating operation can be accomplished, depending on the polarity of the electrical voltage applied to the Peltier element.

In this context it should be pointed out that the term Peltier element in the singular encompasses a unit that contains several Peltier elements that are operatively combined to one plate, whereby the plate is equipped on both with the mentioned heat exchanger elements and therefore forms a separation wall between the interior channel and the middle channel.

In the case of sufficient temperature difference between external air and internal air the operational mode air/air heat exchange is selected in the case of which the Peltier element deactivates, meaning it is without electricity and consumes therefore no electrical energy. Electrical energy is only required for the operation of one or several blowers.

In the case of high external temperature when the air/air heat exchange is no longer sufficient in order to maintain the electronic components in their operating temperature range one switches to Peltier operation and initiates thereby active cooling.

In some application cases, for example if a switch box is installed in an external area, heating operation can also be required. Here also one switches to Peltier operation and the Peltier element is deployed as a heating element.

The air conditioning device according to the invention can be realized as a very flat construction unit that can be attached to the outer wall or to a door of a switch box, as well as also as a slide-in into a switch box so that the air conditioning device can be deployed specifically at certain locations in the switch box where, because of the components disposed there, particularly high temperatures can arise.

BRIEF DESCRIPTION OF THE FIGURES

In what follows the invention is explained in more detail based on embodiment examples in connection with the drawing. It is shown.

DETAILED DESCRIPTION OF PREFERRED EMBODIMENTS

Figure 1:
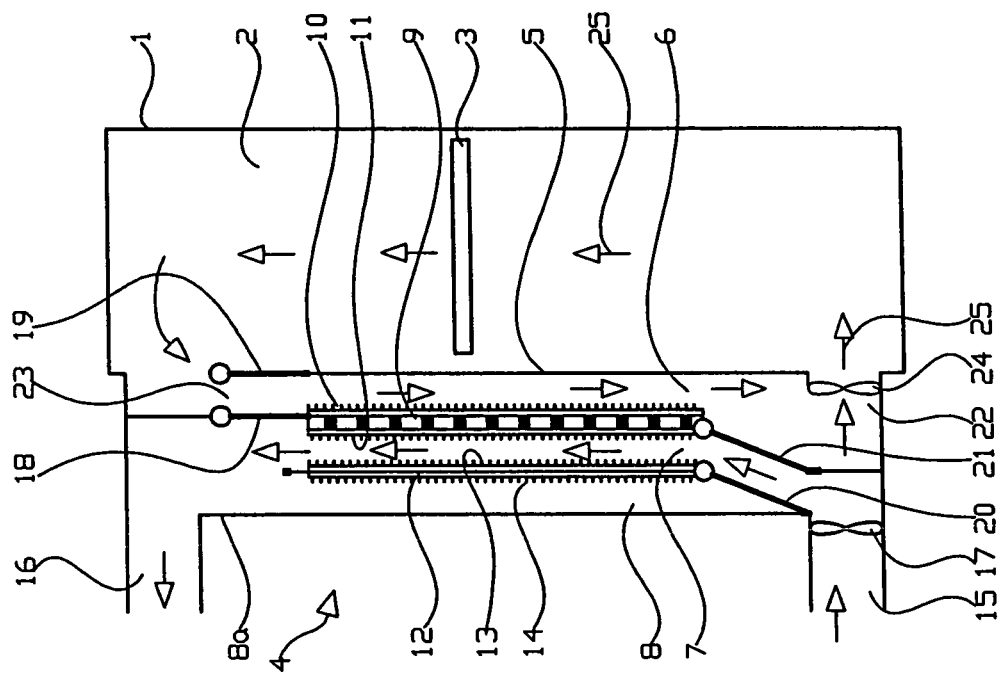
FIG. 1, a schematic sketch of an air conditioning device according to the invention in the operation mode air/air heat exchange.

FIG. 1 shows a switch box with an interior space 2 in which one or several electronic devices 3 are disposed.

The air conditioning device 4 according to the invention is attached to the outer wall of the switch box, whereby this outer wall 5 forms at the same time a wall of an interior channel 6.

A middle channel 7 and an exterior channel 8 align themselves to the interior channel 6. The interior channel 6 and the middle channel 7 are separated from each other by means of a Peltier element 9 that is covered on both sides with heat exchanger elements 10 and 11. The heat exchanger elements 10 point to the interior channel 6. The heat exchanger elements 11 point to the middle channel 7.

The middle channel 7 and the exterior channel 8 are separated from each other by means of a partition 12 that is also covered on both sides with heat exchanger elements 13 and 14. The heat exchanger elements 13 point to the middle channel. The heat exchanger elements 14 point to the exterior channel. The exterior channel is bounded by the outer wall 8a.

The exterior channel 8 features an air intake 15 for exterior air and on its other end an air exhaust 16 for the exterior air. A ventilator 17 is disposed here close to the air intake 15 and assures that external air flows from the air intake 15 through a selected channel and is discharged at the air exhaust 16. At the air intake a muffler that is not represented or an also not represented dirt- and/or moisture filter can additionally be disposed.

At both ends of the three mentioned channels 6, 7, 8 switchable flaps 18, 19, 20, 21 are attached. The first flap 18 is switchable between the partition 12 and the Peltier element 9. The second flap 19 is switchable between the Peltier element and the wall 5. The third flap 20 is switchable between the partition 12 and the outer wall of the air conditioning device 4. The fourth flap 21 is switchable between the Peltier element and a housing part.

The air conditioning device 4 is furthermore connected with an air intake 22 with the interior space 2, through which air by means of a ventilator 24 is conveyed through the interior space 2 in the direction of the arrows 25 and is guided by means of an air exhaust of the interior space 2 back to the air conditioning device 4. The internal air is therefore guided in a closed circulation in the direction of the arrows 25 through the interior space 2 and the air conditioning device so that no external air and thereby also no contamination and moisture can reach the interior space 2. The ventilator 24 for the circulation of the internal air can also be disposed at the air exhaust 23 or at a suitable position next to the channels.

The external air is guided along the arrows 18.

In the operating mode presented in FIG. 1 the flaps 18 to 21 are adjusted in such a manner that the external air flows along the arrow 18 through the exterior channel 8 and the internal air flows through the middle channel 7, whereby internal and external air flow in opposite direction, meaning in counter current operation. Internal and external air therefore flow along the heat exchanger elements 13 and 14 and are thereby in an air/air heat exchange relation. The interior channel 6 is thereby blocked to the flow of the internal air and the Peltier element 9 is without electricity and thereby inactive.

Figure 2:
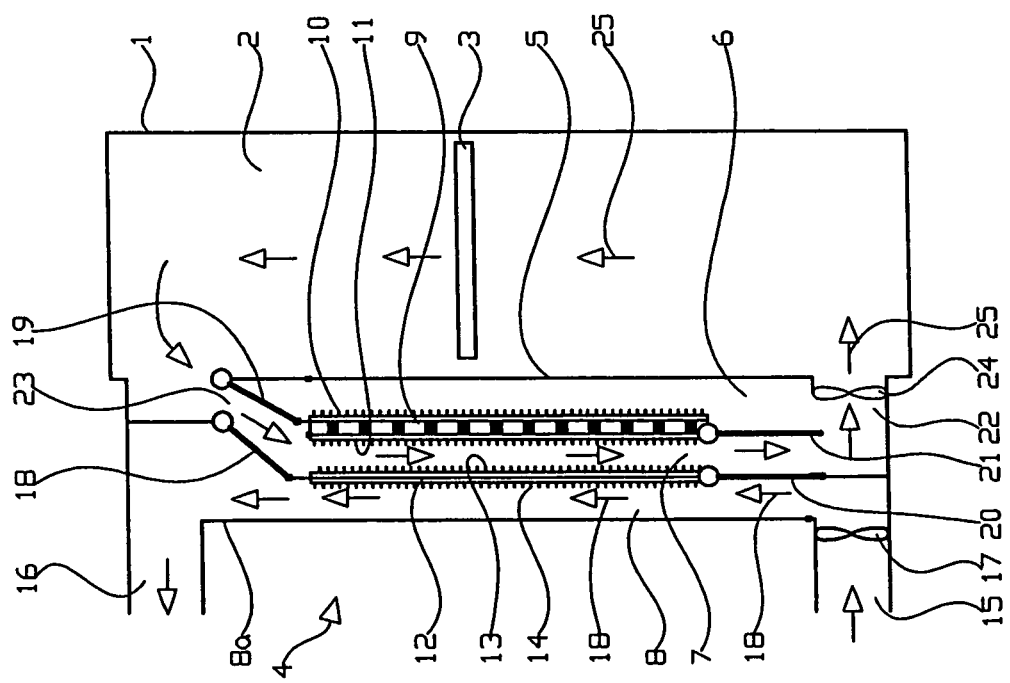
FIG. 2, the air conditioning device according to the invention in the operation mode Peltier heat exchange.

In the mode of operation in FIG. 2 the flaps 18 to 21 are selected in such a manner that the exterior air flows through the middle channel 7 and the interior air flows through the interior channel 6. These two air streams flow along also in a counter current on both sides of the Peltier element 9 and its heat exchange elements 10 and 11. During cooling operation the side of the Peltier element 9 pointing to the interior channel 6 is the cold side and the side pointing to the middle channel 7 is the hot side. The warmed air coming from the interior space 2 is therefore cooled off in the interior channel 6. The heat of the cold side transported by means of the Peltier element 9 toward the hot side is discharged by means of the external air that flows through the middle channel. Thereby an active cooling of the interior space is achieved by means of the active Peltier element.

During heating operation, which is likewise possible in the configuration of the FIG. 2, the Peltier element 9 is utilized as a heating element. The hot side then points in that case to the interior channel 6 and the cold side to the middle channel 7. The cold air flowing from the interior space 2 through the interior channel 6 is heated and in the middle channel the "cold" is discharged by means of the external air.

It is clear to the person skilled in the art that for the more refined adjustment depending on the temperature of the internal air and the external air the number of revolutions of one of the ventilators 17 and 24 as well as also both ventilators 17 and 24 can be modified, and in the case of Peltier operation in addition or alternatively also the cooling power of the Peltier element by means of adjustment of the electrical energy that is fed to the Peltier element or also by means of corresponding switching of the individual elements of the Peltier element 9 in a parallel circuit, group-wise series circuit or series circuit.

Figure 3:
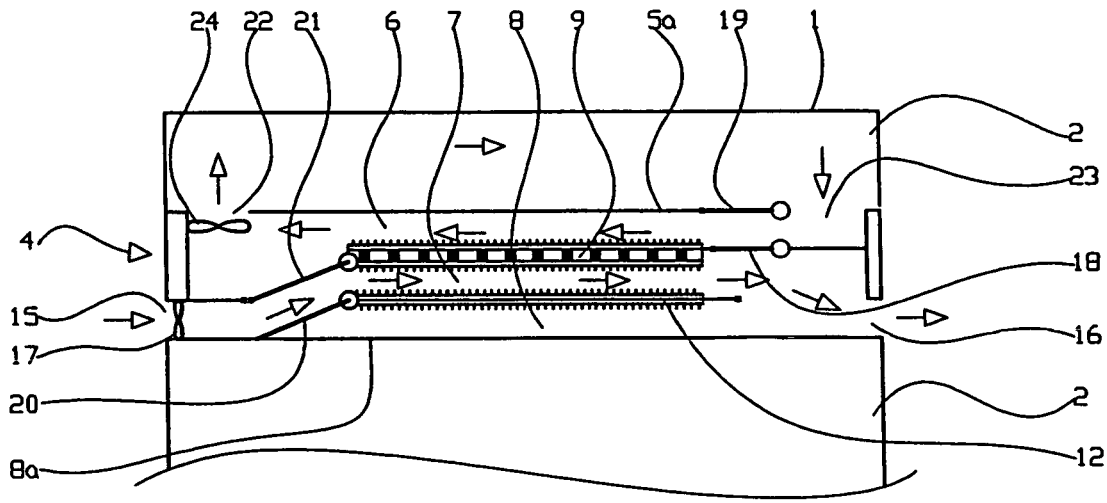
FIG. 3, the air conditioning device according to the invention during installation in a switch box in the operation mode Peltier heat exchange and FIG. 4, the air conditioning device of FIG. 3 in the operation mode air/air heat exchange.
Figure 4:
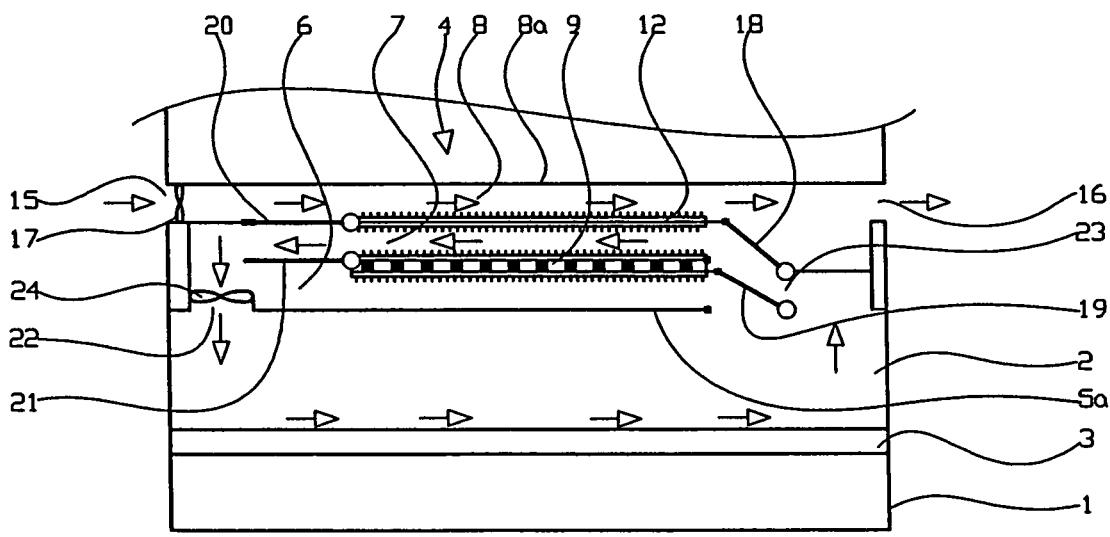

The FIGS. 3 and 4 show the installation of the air conditioning device 4 in the interior space 2 of the switch box 1. The air conditioning device 4 is thereby a slide-in that is inserted into the switch box and not, as in FIGS. 1 and 2, attached to an outer wall or door of the switch box.

The air conditioning device 4 of the FIGS. 3 and 4 has here two independent outer walls 5a and 8a. The wall 5a border to the interior channel 6 and the wall 8a the exterior channel 8. The air intake and the air exhaust 16 for the external air are provided as lateral openings, whereby the switch box 1 features openings flush therewith. The air intake 22 for the supply of the internal air into the interior space and the corresponding air exhaust 23 are facing the interior space 2 and lay in the representation of FIGS. 3 and 4 in a horizontal plane. In FIG. 3 the internal air leaves the air conditioning device in the upward direction into the interior space 2, while in FIG. 4 the air is blown downward into the interior space 2. One recognizes the flexibility of installation possibilities.

In FIG. 3 the flaps 18 to 21 are adjusted for Peltier operation and in FIG. 4 for air/air heat exchange operation.

It is obvious that the air conditioning device, analogous to the embodiment examples of the FIGS. 3 and 4, can also be installed on a floor wall or a ceiling wall of the switch box 1, whereby then the wall 8a of the air conditioning device can in turn be left off and be replaced by the corresponding wall of the switch box 1. Air intake 15 and air exhaust 16 for the external air can also be disposed in such a manner that the air flows in and out vertically to the wall 8a. Finally it should also be pointed out that the heat exchange elements 10, 11, 13 and 14 are preferably implemented according to DE 102 33 736 B3 whose disclosure is herewith completely incorporated. These heat exchange elements have the significant advantage of a very low design height with exceptional heat exchange capability. Finally it should be pointed out that the wall 5 can also be equipped with heat exchange elements, which is useful when this wall itself is heat conducting, meaning it is in particular made of metal.

It should also be pointed out that the wall 12 and the Peltier elements 9 together with the associated heat exchange elements can be exchanged, which in that case of course requires an adaptation of the control of the flaps 18 to 21. The terms interior channel, middle channel, and exterior channel channel are therefore not to be understood in a limiting manner and can also be interpreted as first, second and third channel, independently of their relative location in reference to the interior space.

In summary, the invention produces a hybrid device of very compact construction with high power density and low energy requirement that features at least two operation modes, namely air/air heat exchange (convection) and active cooling (Peltier operation). The device can be operated in an expanded temperature range, namely when the external temperature is higher than the internal temperature as well as when the external temperature is lower than the internal temperature. In the operation mode air/air heat exchange in the case of switched-off Peltier elements the components of the Peltier elements are preserved and the lifetime of the Peltier elements is increased.

The invention claimed is:

1. Air conditioning device for cooling electronic components, the device comprising:
a partition that is equipped with heat exchange elements on both sides and which partition borders an exterior channel, said exterior channel having an intake and an exhaust for a flowing first fluid, whereby the device has a first operation mode in which a second fluid, at a side of the partition facing away from the exterior channel, is in a heat exchange with the first fluid and the electronic components,
wherein the air conditioning device includes three channels, the exterior channel, a middle channel, and an interior channel in parallel side-by-side relationship defined by a first exterior wall, the partition, a Peltier element, and a second exterior wall,
wherein the partition separates the exterior channel from the middle channel,
wherein the Peltier element is equipped on both sides with heat exchange elements and separates the middle channel from the interior channel,
wherein switchable flaps are provided at ends of the channels said switchable flaps guiding the first fluid in a selectable manner such that in said first operation mode, the first fluid is guided into the exterior channel, and the second fluid is guided into the middle channel, and in a second operation mode, the first fluid is guided into the middle channel and the second fluid is guided into the exterior channel,
wherein the first fluid is external air and the intake for said first fluid is adapted to intake external air,
wherein the exhaust for the first fluid exhausts said first fluid away from the electronic components, and
wherein the second fluid is internal air and an intake for the second fluid intakes internal air which contacts the electronic components within an interior space.

2. Air conditioning device according to claim 1, characterized in that the interior space is of a control cabinet in which the electronic components are disposed.

3. Air conditioning device according to claim 2, characterized in that respectively a ventilator is provided for the internal air and the external air.

4. Air conditioning device according to claim 1, characterized in that the Peltier element is switched, in a third operation mode, as a heating element for the heating of the second fluid.

5. Air conditioning device according to claim 1, characterized in that it is installed on an outer wall or a door of a control cabinet, whereby its outer wall delimits the interior channel.

6. Air conditioning device according to claim 1, characterized in that it is implemented as a slide-in for a control cabinet that features, for external air, an intake and an exhaust opening that are aligned with the intake and the exhaust for the first fluid.

7. Air conditioning device according to claim 1, characterized in that the Peltier element is deactivated in the first operation mode and is adjustable in the second operation mode in regard to its electrical energy intake.

8. Air conditioning device according to claim 3, characterized in that a rotational speed of at least one of the ventilators is adjustable.

9. Air conditioning device according to claim 2, characterized in that the Peltier element is switched, in a third operation mode, as a heating element for the heating of the second fluid.

10. Air conditioning device according to claim 2, characterized in that it is installed on an outer wall or a door of a control cabinet, whereby its outer wall delimits the interior channel.

11. Air conditioning device according to claim 2, characterized in that it is implemented as a slide-in for a control cabinet that features, for external air, an intake and an exhaust opening that are aligned with the intake and the exhaust for the first fluid.

12. Air conditioning device according to claim 2, characterized in that the Peltier element is deactivated in a the first operation mode and is adjustable in the second operation mode in regard to its electrical energy intake.

13. Air conditioning device according to claim 3, characterized in that the Peltier element is switched, in a third operation mode, as a heating element for the heating of the second fluid.

14. Air conditioning device according to claim 3, characterized in that it is installed on an outer wall or a door of a control cabinet, whereby its outer wall delimits the interior channel.

15. Air conditioning device according to claim 3, characterized in that it is implemented as a slide-in for a control cabinet that features, for external air, an intake and an exhaust opening that are aligned with the intake and the exhaust for the first fluid.

16. Air conditioning device according to claim 3, characterized in that the Peltier element is deactivated in the first operation mode and is adjustable in the second operation mode in regard to its electrical energy intake.

* * * * *